(12) United States Patent
Matsuno et al.

(10) Patent No.: US 8,538,630 B2
(45) Date of Patent: Sep. 17, 2013

(54) A/D CONVERSION DEVICE AND VIBRATION DAMPING APPARATUS FOR AUTOMOBILE USING THE A/D CONVERSION DEVICE

(75) Inventors: Keisuke Matsuno, Ise (JP); Hidetoshi Katada, Ise (JP); Takeshi Tomizaki, Ise (JP); Hideaki Moriya, Ise (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 13/457,793

(22) Filed: Apr. 27, 2012

(65) Prior Publication Data

US 2012/0215405 A1 Aug. 23, 2012

Related U.S. Application Data

(63) Continuation of application No. PCT/JP2010/070126, filed on Nov. 11, 2010.

(30) Foreign Application Priority Data

Nov. 13, 2009 (JP) ................................. 2009-259685

(51) Int. Cl.
*H03M 1/18* (2006.01)
*F16F 15/02* (2006.01)

(52) U.S. Cl.
USPC ............... 701/36; 701/37; 701/111; 701/101; 701/54; 702/56; 702/85; 381/71.1

(58) Field of Classification Search
USPC .................. 701/36, 37, 111, 101, 54; 702/56, 702/85; 381/71.1
See application file for complete search history.

(56) References Cited

U.S. PATENT DOCUMENTS

| | | | | |
|---|---|---|---|---|
| 4,345,472 A | * | 8/1982 | Hara et al. | 73/462 |
| 4,364,027 A | * | 12/1982 | Murooka | 341/120 |
| 4,933,676 A | * | 6/1990 | Hauge et al. | 341/141 |

(Continued)

FOREIGN PATENT DOCUMENTS

| EP | 0 758 740 A2 | 2/1997 |
|---|---|---|
| EP | 0 966 105 A2 | 12/1999 |

(Continued)

OTHER PUBLICATIONS

Gregers-Hansen et al., A stacked analog-to-digital converter for increased radar signal processor dynamic range, Jun. 2001, NRL.*

(Continued)

*Primary Examiner* — Thomas Black
*Assistant Examiner* — Sara Lewandroski
(74) *Attorney, Agent, or Firm* — Oblon, Spivak, McClelland, Maier & Neustadt, L.L.P.

(57) ABSTRACT

An A/D conversion device includes a first A/D converter that receives an analog vibration signal corresponding to a vibration detected by a vibration detecting sensor and converts the analog vibration signal to a first digital value, an analog amplifier that amplifies the analog vibration signal and outputs an amplified signal, a second A/D converter that converts the amplified signal to a second digital value, a determiner that determines whether an amplitude of the amplified signal input to the second A/D converter exceeds a range of amplitude that is convertible by the second A/D converter, and a selector that receives the first digital value and the second digital value and output one of the first and second digital values based on the determination of the determiner.

12 Claims, 6 Drawing Sheets

(56) References Cited

U.S. PATENT DOCUMENTS

| | | | | |
|---|---|---|---|---|
| 5,048,059 | A * | 9/1991 | Dent | 375/340 |
| 5,117,929 | A * | 6/1992 | Nakamura et al. | 177/185 |
| 5,164,726 | A * | 11/1992 | Bernstein et al. | 341/120 |
| 5,175,687 | A * | 12/1992 | Tsutsumi et al. | 701/37 |
| 5,245,664 | A * | 9/1993 | Kinoshite et al. | 381/71.4 |
| 5,331,934 | A * | 7/1994 | Asama et al. | 477/111 |
| 5,332,061 | A * | 7/1994 | Majeed et al. | 180/312 |
| 5,677,962 | A * | 10/1997 | Harrison et al. | 381/109 |
| 5,809,090 | A * | 9/1998 | Buternowsky et al. | 375/347 |
| 5,845,236 | A * | 12/1998 | Jolly et al. | 702/195 |
| 5,847,658 | A * | 12/1998 | Irie et al. | 340/683 |
| RE36,411 | E * | 11/1999 | Nakamura et al. | 177/185 |
| 6,456,945 | B1 * | 9/2002 | Sonnichsen et al. | 702/56 |
| 6,580,383 | B1 * | 6/2003 | Devendorf et al. | 341/143 |
| 6,937,954 | B2 * | 8/2005 | Jeong et al. | 702/92 |
| 7,271,756 | B2 * | 9/2007 | Budzelaar | 341/155 |
| 7,525,050 | B1 * | 4/2009 | Weaver et al. | 178/18.04 |
| 8,110,757 | B1 * | 2/2012 | Weaver et al. | 178/18.04 |
| 8,130,126 | B2 * | 3/2012 | Breitschadel et al. | 341/139 |
| 2004/0141417 | A1 * | 7/2004 | Wakabayashi et al. | 367/98 |
| 2005/0068221 | A1 * | 3/2005 | Freeman et al. | 341/161 |
| 2005/0075805 | A1 * | 4/2005 | Chuang | 702/56 |
| 2006/0244452 | A1 * | 11/2006 | Den Boef | 324/322 |
| 2007/0234879 | A1 * | 10/2007 | Kobayashi et al. | 84/600 |
| 2008/0192948 | A1 * | 8/2008 | Kan et al. | 381/71.4 |
| 2009/0128390 | A1 * | 5/2009 | Hong et al. | 341/163 |
| 2009/0167574 | A1 * | 7/2009 | Liu | 341/110 |
| 2010/0268484 | A1 * | 10/2010 | Shimada | 702/45 |

FOREIGN PATENT DOCUMENTS

| | | |
|---|---|---|
| GB | 2 396 417 A | 6/2004 |
| JP | 03-032226 A | 2/1991 |
| JP | 11-340831 A | 12/1999 |
| JP | 2000-027931 A | 1/2000 |

OTHER PUBLICATIONS

OPA698, Unit-gain stable, Wideband Voltage Limiting Amplifier, Nov. 2002, Texas Instruments.*
TPA2013D1, 2.7-W constant output power class-D audio amplifier with integrated boost converter, Aug. 2007, Texas Instruments.*
MIC6251/6252, IttyBitty GainBlock Amplifiers, Jul. 1998, Micrel.*
Extended Search Report issued May 8, 2013 in European Patent Application No. 10829993.4.
Douglas Butler, et al., "Dual 8-bit ADCs Provide Pseudo High Resolution", EDN Electrical Design News, vol. 44, No. 21, Oct. 14, 1999, XP000927106, p. 152.

* cited by examiner

FIG. 5 WHEN VIBRATION AMPLITUDE VALUE IS ABSENT IN MINUTE REGION (OUTSIDE RANGE OF 2.5 V ± 0.625 V)

A/D CONVERSION DEVICE AND VIBRATION DAMPING APPARATUS FOR AUTOMOBILE USING THE A/D CONVERSION DEVICE

CROSS-REFERENCE TO RELATED APPLICATION

This application is a continuation application of International Application No. PCT/JP2010/070126, filed Nov. 11, 2010, the entire content of which is incorporated herein by reference. PCT/JP2010/070126 claims priority to JP 2009-259685, filed Nov. 13, 2009, the content of which is also incorporated herein by reference.

TECHNICAL FIELD

The present disclosure relates to an A/D conversion device that properly performs A/D conversion of a signal from a vibration sensor, or a damping device to which it is applied, and a vehicle equipped with them.

BACKGROUND ART

Conventionally, there is known a damping device that cancels out a vibration generated by a vibration generating source such as an engine of a vehicle and a canceling vibration generated through vibrating means at the position where damping should be carried out. As such a conventional damping device, Patent Document 1 discloses a damping device including a control section that generates a vibrating command signal for canceling out a vibration transmitted from a vibration generating source to a position where damping should be carried out, vibrating means that operates through input of the vibrating command signal generated by this control section and generates a canceling vibration to the position where damping should be carried out, and a vibration detecting sensor such as an acceleration sensor that detects a vibration remaining as a canceling error between the vibration generated by the vibration generating source and the canceling vibration at the position where damping should be carried out, wherein the control section modifies the vibrating command signal so that the vibration remaining as the canceling error may become small based on the vibration detected by the vibration detecting sensor.

In this damping device, an analog vibration signal output from the vibration detecting sensor is converted to a digital value by an A/D conversion device and damping control is carried out by using this digital value.

PRIOR ART DOCUMENT

Patent Document

Patent Document 1: Japanese Patent Laid-open No. 2000-27931

SUMMARY OF DISCLOSURE

Technical Problem

The A/D conversion device provided in the above-described damping device is required to have such a high resolution as to detect change in a minute vibration in the vicinity of level 0 without missing it in order to determine whether or not the present state is the state in which damping is achieved, and is required to have a wide range as the convertible amplitude range in order to respond to vibrations with various magnitudes.

To meet these both requirements, it will be considered to use an A/D converter that balances a wide range as the convertible amplitude range and a high resolution. However, such an A/D converter is not preferable because it is expensive and causes increase in the manufacturing cost.

Furthermore, as one measure to obtain a high resolution without using such an expensive A/D converter, a configuration in which an analog vibration signal amplified through an amplitude amplifier is input to an A/D converter that is inexpensive and has a low resolution will be considered. However, in this configuration, the range of the amplitude that can be A/D-converted is narrowed although a high resolution is obtained. Thus, there is a problem that the state becomes the input saturation state and conversion to an accurate digital value becomes impossible when a vibration with large amplitude is input.

The present disclosure is made with focus on such problems and an object thereof is to realize an A/D conversion device that has a high resolution and has a wide range as the convertible amplitude range without causing increase in the manufacturing cost, and thus provide a damping device having enhanced damping performance and a vehicle equipped with them.

Technical Solution

The present disclosure takes the following means in order to achieve this object.

Specifically, the A/D conversion device of the present disclosure is an A/D conversion device to which a signal from a vibration detecting sensor that detects a vibration is input and that converts the signal to a digital value and outputs the converted digital value to an external. The A/D conversion device is characterized by including a first A/D converter to which an analog vibration signal corresponding to the signal input from the vibration detecting sensor is input and that converts the analog vibration signal to a digital value, a second A/D converter to which an amplified signal equivalent to a signal obtained by amplifying the analog vibration signal input to the first A/D converter is input and that converts the amplified signal to a digital value, a determiner that determines whether or not a state is an input saturation state in which the amplitude value of the amplified signal input to the second A/D converter exceeds the range of amplitude that is convertible by the second A/D converter, and a selector that outputs the digital value converted by the first A/D converter if it is determined by the determiner that the state is the input saturation state, and outputs the digital value converted by the second A/D converter if it is determined by the determiner that the state is not the input saturation state.

If the configuration is made in this manner, when the state is not the input saturation state in which the amplitude value of the amplified signal input to the second A/D converter exceeds the range of the amplitude that can be converted by the second A/D converter, i.e. when the detected vibration is present in a minute region, the amplified signal is digitalized to digitalize the amplitude value of the vibration in the minute region at a high resolution. On the other hand, when the state is the input saturation state, i.e. when the detected vibration exceeds the minute region, the analog vibration signal is digitalized to identify the amplitude value of the vibration in the wide-range region other than the minute region at a normal resolution. Thereby, the amplitude value of the vibration in the wide-range region can be accurately captured and the amplitude value of the vibration in the minute region for which a high resolution is necessary can be properly digitalized.

In particular, to effectively determine whether or not the state is the input saturation state, it is preferable that the determiner determine that the state is the input saturation state if the digital value obtained by either one of the first A/D converter or the second A/D converter exceeds a predetermined threshold and determine that the state is not the input saturation state if the digital value does not exceed the predetermined threshold.

To ensure the continuity of the digital value indicating the amplitude value of the vibration and prevent the occurrence of data missing, it is desirable that a change rate for amplitude value variation of the signal input from the vibration detecting sensor and a zero point be equalized between the digital value that is obtained by the first A/D converter and is output to the external and the digital value that is obtained by the second A/D converter and is output to the external.

It is preferable that the A/D conversion device of the present disclosure be applied to a damping device required to detect a minute vibration in the vicinity of level 0 and so forth.

This damping device can be applied particularly favorably in being mounted in a vehicle and damping the vibration generated from an engine.

Advantageous Effects

As described above, in the present disclosure, it is determined whether or not the state is the input saturation state in which the amplitude value of the amplified signal input to the second A/D converter exceeds the range of the amplitude that can be converted by the second A/D converter. If it is determined that the state is the input saturation state, the digital value obtained by converting the analog vibration signal is output. If it is determined that the state is not the input saturation state, the digital value obtained by converting the amplified signal equivalent to a signal obtained by amplifying the analog vibration signal is output. This can realize A/D conversion in which the resolution becomes a high resolution when the state is not the input saturation state and the convertible amplitude range becomes a wide range when the state is the input saturation state. Thus, the damping performance can be enhanced.

DETAILED DESCRIPTION

One embodiment of the present disclosure will be described below with reference to the drawings.

Figure 1:
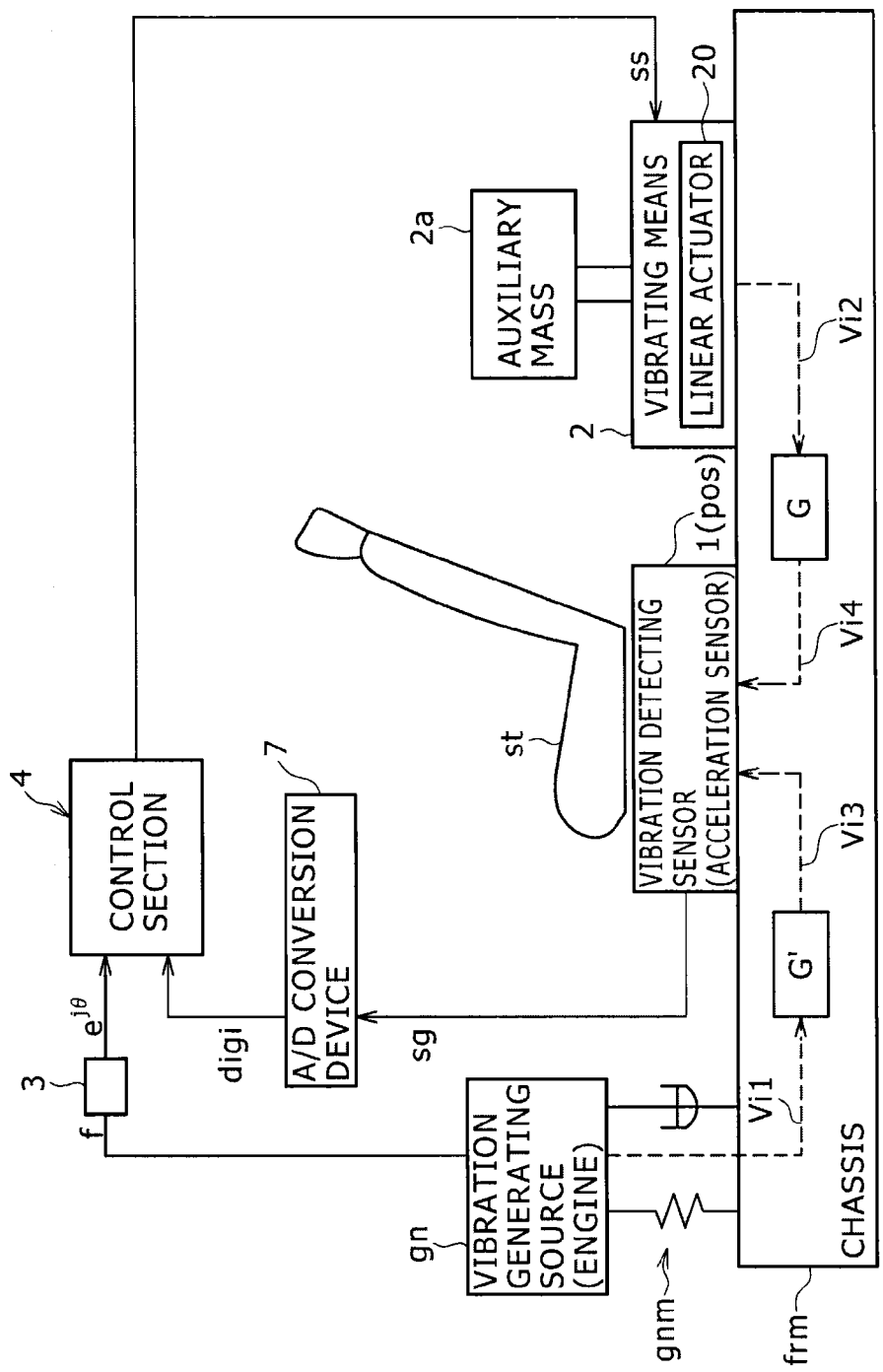
FIG. 1 is a schematic configuration diagram of application of a damping device according to one embodiment of the present disclosure to a vehicle.

As shown in FIG. 1, a damping device of this embodiment is mounted in a vehicle such as a car and has a vibration detecting sensor 1 such as an acceleration sensor provided at a position pos where damping should be carried out, such as a seat st, vibrating means 2 using a linear actuator 20 that vibrates auxiliary mass 2a having predetermined mass to thereby generate a canceling vibration Vi4 to the position pos where damping should be carried out. The damping device further has reference wave generating means 3 that generates a reference wave $e^{j\theta}$ from a fundamental frequency f extracted from an ignition pulse of an engine as a vibration generating source gn, an A/D conversion device 7 that converts an analog vibration signal sg from the vibration detecting sensor 1 to a digital value digi, and a control section 4 to which the digital value digi from the A/D conversion device 7 and the above-described reference wave $e^{j\theta}$ are input and that makes the vibrating means 2 generate the canceling vibration Vi4 to the position pos where damping should be carried out. The damping device cancels out a vibration Vi3 generated in the vibration generating source gn such as the engine mounted on a chassis form with the intermediary of an insulator (engine mount) gnm and the canceling vibration Vi4 generated through the vibrating means 2 at the position pos where damping should be carried out, to reduce the vibration at the position pos where damping should be carried out.

The vibration detecting sensor 1 detects the main vibration in the same direction as the main vibration direction of the engine by using the acceleration sensor or the like, and outputs the analog vibration signal sg indicating the amplitude value of the vibration by a voltage.

Figure 2:
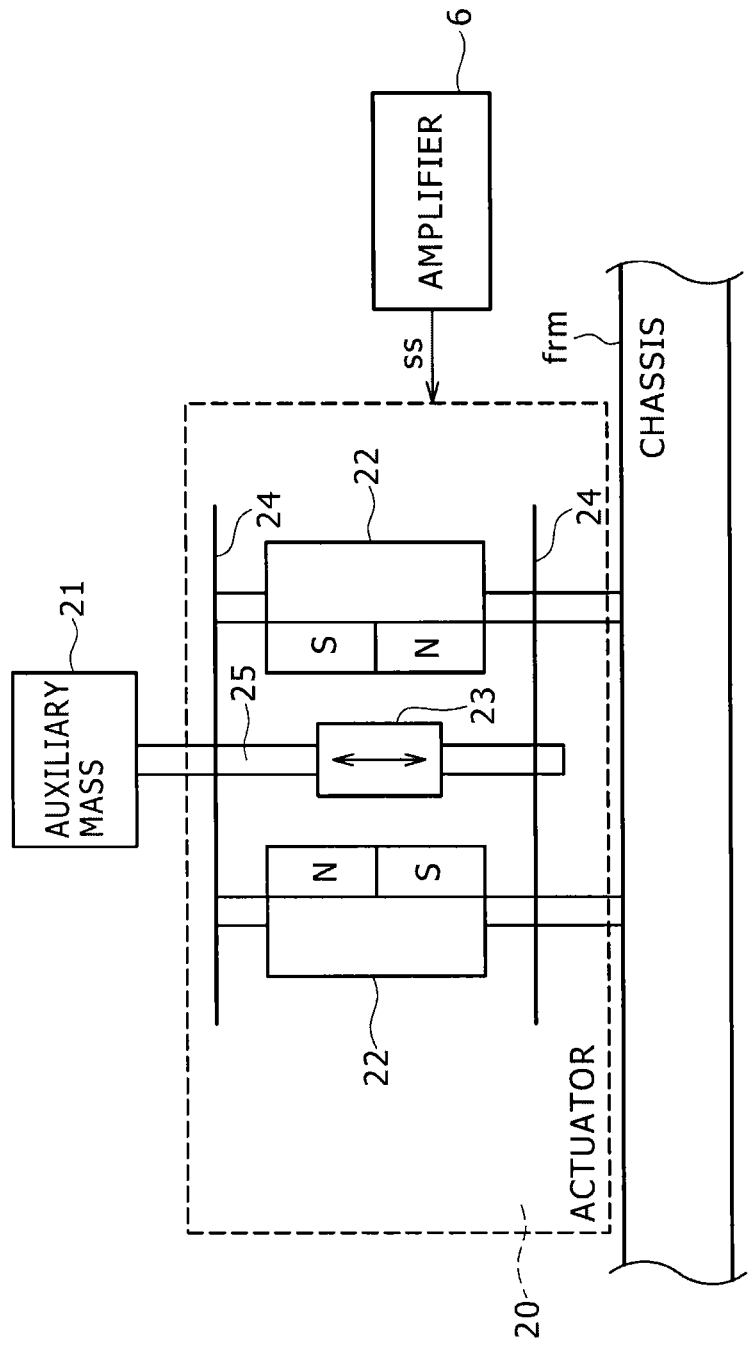
FIG. 2 is a schematic configuration diagram of vibrating means including a linear actuator that configures the damping device.

As shown in FIG. 2, the linear actuator 20 is an actuator of a reciprocal type in which stators 22 having permanent magnets are fixed to the chassis form and a movable element 23 is made to perform reciprocal motion in the same direction as the direction of the vibration that should be suppressed (upward and downward motion in the plane of paper of FIG. 2). Here, the linear actuator 20 is fixed to the chassis form in such a manner that the direction of the vibration of the chassis form as the suppression target corresponds with the reciprocal direction (thrust direction) of the movable element 23. The movable element 23 is attached to a shaft 25 together with the auxiliary mass 21 and this shaft 25 is supported by the stators 22 with the intermediary of plate springs 24 in such a manner that the movable element 23 and the auxiliary mass 21 can be moved in the thrust direction. A dynamic vibration absorber is configured by the linear actuator 20 and the auxiliary mass 21.

When an AC current (sine-wave current, rectangular-wave current) is made to flow through a coil (not shown) configuring the linear actuator 20, in the state in which a current in a predetermined direction flows through the coil, magnetic flux is led from the S-pole to the N-pole in the permanent magnet and thereby a magnetic flux loop is formed. As a result, the movable element 23 moves in the gravity-defying direction (upward direction). On the other hand, when a current in the opposite direction of the predetermined direction is made to flow through the coil, the movable element 23 moves in the gravity direction (downward direction). The movable element 23 repeats the above-described operation through alternate change of the flow direction of the current to the coil by the AC current and performs reciprocal motion along the axis direction of the shaft 25 relative to the stators 22. This vibrates the auxiliary mass 21 bonded to the shaft 25 in the upward and downward directions. Explanation of more specific structure and operation of this linear actuator 20 itself is publicly known and therefore details are omitted. The operation range of the movable element 23 is restricted by a stopper that is not shown. The dynamic vibration absorber configured by the linear actuator 20 and the auxiliary mass 21 controls the acceleration of the auxiliary mass 21 to adjust the damping force based on an actuator control current ss output from an amplifier 6, and thereby can cancel out the vibration generated in the chassis form to reduce the vibration.

Figure 3:
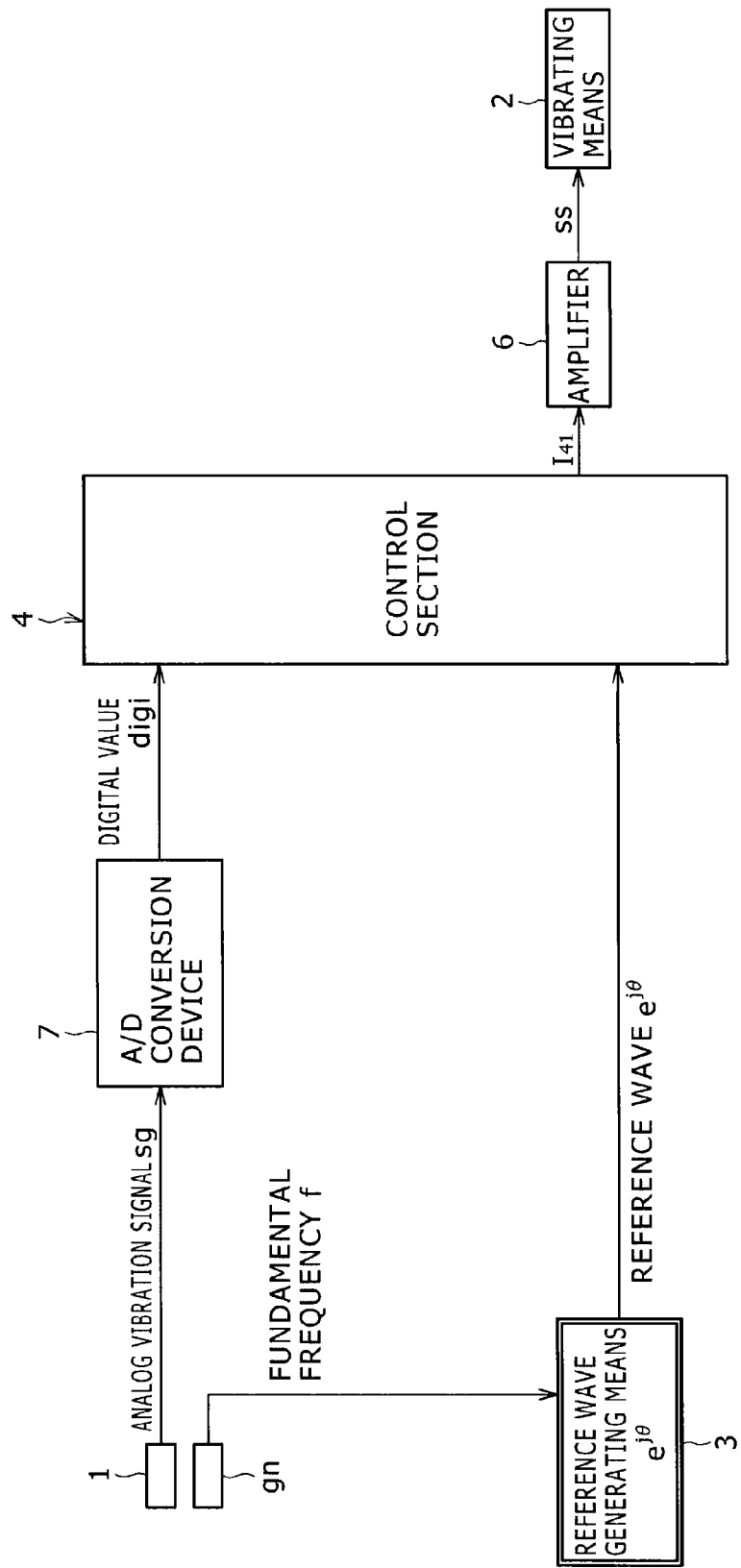
FIG. 3 is a block diagram showing a configuration relating to a control section and an A/D conversion device of the damping device.

As shown in FIG. 3, the reference wave generating means 3 generates a reference sine wave (sin θ) and a reference cosine wave (cos θ) that are the reference wave $e^{jθ}$ of the fundamental order from the fundamental frequency f [Hz]. The generated reference sine wave (sine) and reference cosine wave (cos θ) may be synchronized with any synchronizing signal or may be not synchronized. An equation θ=ωt=2πft holds.

The A/D conversion device 7 converts the analog vibration signal sg input from the vibration detecting sensor 1 to the digital value digi that is a digital signal. Details will be described later.

The control section 4 controls the vibration by adaptive control. It calculates an adaptive filter coefficient (Re, Im) from the digital value digi converted by the A/D conversion device 7 and the above-described reference wave $e^{jθ}$ and generates a vibrating command signal $I_{41}$ based on this adaptive filter coefficient (Re, Im). Based on it, the control section 4 inputs the actuator control current ss to the linear actuator 20 via the amplifier 6 to be described later to thereby generate the canceling vibration Vi4 that is in antiphase with the vibration from the above-described vibration generating source gn to the position pos where damping should be carried out through the vibrating means 2. When the calculation of the adaptive filter coefficient (Re, Im) is repeated, the amplitude value and phase of the canceling vibration Vi4 converge on the amplitude value and phase of the vibration Vi3, which should be damped, and the vibration canceling progresses along with the convergence. However, because the fundamental frequency f and the amplitude value and phase of the vibration Vi3 constantly change, the control is carried out in the form of always following the change.

In carrying out such damping control, the A/D conversion device 7 is required to have such a high resolution as to properly convert change in the minute vibration in the vicinity of level 0 to the digital value in order to determine whether or not the present state is the state in which damping is achieved, and is required to have a wide range as the range of the amplitude that can be digital-converted in order to response to vibrations with various magnitudes.

Figure 4:
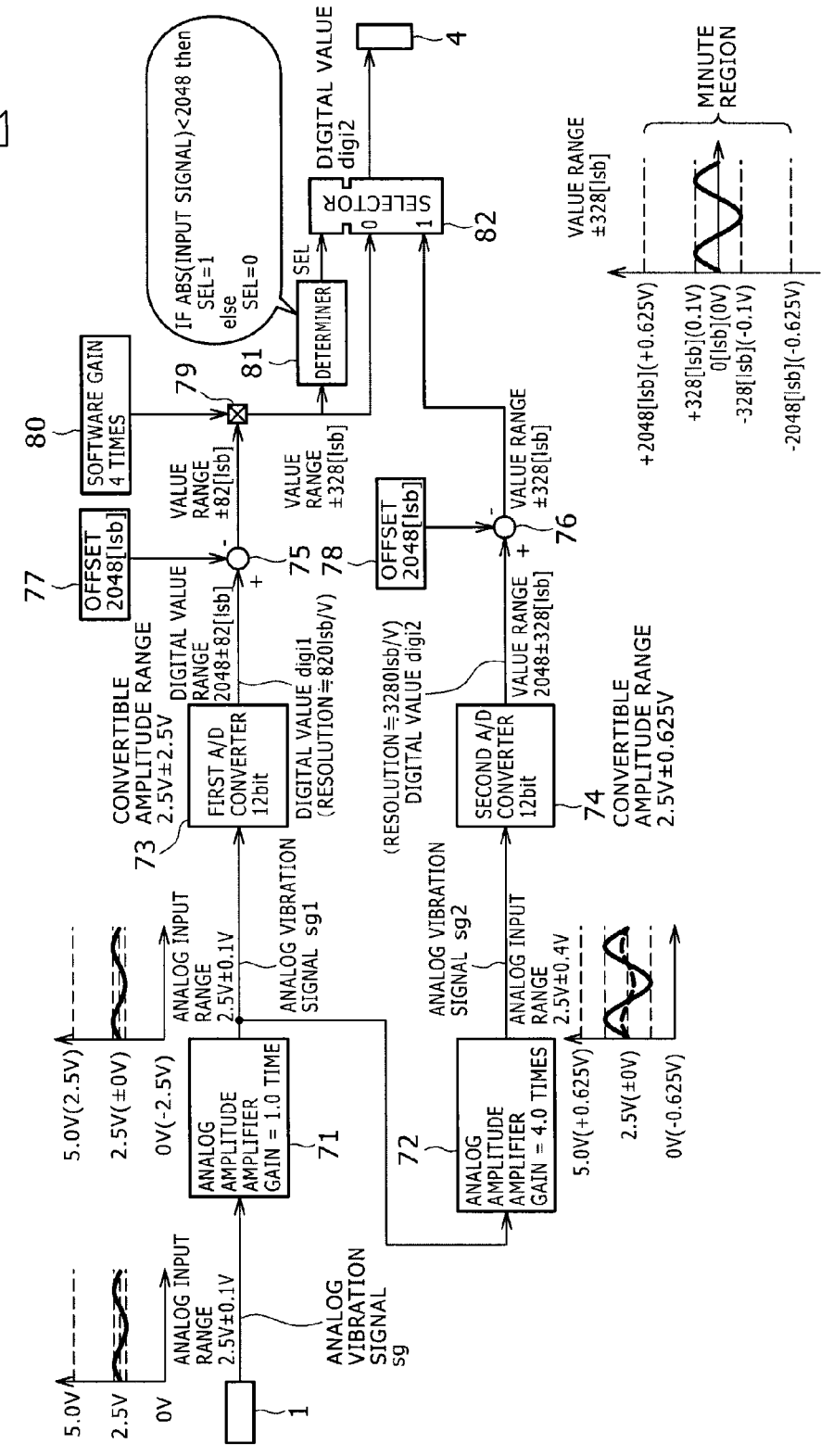
FIG. 4 is a block diagram relating to the configuration of the A/D conversion device and operation when the vibration amplitude value is present in a minute region.

So, in the present embodiment, as shown in FIG. 4, the A/D conversion device 7 is configured by using an inexpensive, general-purpose A/D conversion unit having a digital processing unit such as a CPU and plural A/D converters, and has analog amplitude amplifiers 71 and 72, a first A/D converter 73, a second A/D converter 74, a determiner 81, and a selector 82.

The analog vibration signal sg from the vibration detecting sensor 1, indicating the amplitude value of the vibration by a voltage value, is input to the analog amplitude amplifier 71, and the analog amplitude amplifier 71 outputs an analog vibration signal sg1 obtained by amplifying the amplitude (voltage) of the analog vibration signal sg by a factor of one. The analog vibration signal sg1 output from the analog amplitude amplifier 71 is input to the analog amplitude amplifier 72 and the analog amplitude amplifier 72 outputs an analog vibration signal sg2 that is an amplified signal obtained by amplifying the amplitude (voltage) of the analog vibration signal sg1 by a factor of four. Suppose that the variation width of the voltage of the analog vibration signal sg is 2.5 V±2.0 V.

In the first A/D converter 73 and the second A/D converter 74, the range of the voltage that can be input is 2.5 V±2.5 V and the resolution is 12 bit=4096 [lsb] (lsb is the unit of quantization), and they have the same performance. The analog vibration signal sg1 corresponding to the analog vibration signal sg input from the vibration detecting sensor 1 is input to the first A/D converter 73, and the first A/D converter 73 converts it to a digital value digi1 and outputs it. In this case, the analog vibration signal sg1 input to the first A/D converter 73 is a signal by a gain of one time with respect to the analog vibration signal sg and the range of the voltage that can be input to the first A/D converter 73 is 2.5 V±2.5 V. Thus, the convertible amplitude range (voltage range) on the basis of the analog vibration signal sg is 2.5 V±2.5 V and the effective resolution is about 820 [lsb]/V. The quantizable minimum analog quantity is about 0.0012195 V/[lsb].

Furthermore, the analog vibration signal sg2, which is an amplified signal equivalent to a signal obtained by amplifying the analog vibration signal sg1 input to the first A/D converter 73, is input to the second A/D converter 74, and the second A/D converter 74 converts it to a digital value digi2 and outputs it. In this case, the analog vibration signal sg2 input to the second A/D converter 74 is a signal amplified at a gain of four times with respect to the analog vibration signal sg and the range of the voltage that can be input is 2.5 V±2.5 V. Thus, the convertible amplitude range (voltage range) on the basis of the analog vibration signal sg is 2.5 V±0.625 V and the effective resolution is about 3280 [lsb]/V. The quantizable minimum analog quantity is about 0.0003048 V/[lsb]. In the second A/D converter 74, the effective resolution is enhanced by a factor of four with respect to the first A/D converter 73 but the convertible amplitude range is decreased by a factor of one-fourth.

An offset value of 2048 [lsb] is subtracted from the digital value digi1 and the digital value digi2 output from the first A/D converter 73 and the second A/D converter 74 by adders 75 and 76, respectively. Thereby the reference point (zero point) becomes 0, and the digital values are separately input to the selector 82. The digital value digi1 output from the adder 75 is amplified by a factor of four by a multiplier 79, as a digital amplifier, based on a software gain in order to equalize the change rate for the amplitude value variation of the analog vibration signal sg to that of the digital value digi2, and the amplified digital value is input to the selector 82.

The determiner 81 determines whether or not the state is the input saturation state in which the amplitude value of the analog vibration signal sg2, which is the amplified signal input to the second A/D converter 74, exceeds the range of the amplitude that can be converted by the second A/D converter 74 (2.5 V±0.625 V). Specifically, the determiner 81 detects the digital value digi1 input from the multiplier 79 to the selector 82. It determines that the state is the input saturation state if the absolute value of this digital value digi1 exceeds a predetermined threshold of 2048 [lsb], and determines that the state is not the input saturation state if the absolute value of this digital value digi1 does not exceed the predetermined threshold of 2048 [lsb]. The determiner 81 inputs a determination signal SEL indicating the determination result to the selector 82.

The selector 82 inputs the digital value digi1 converted by the first A/D converter 73 to the control section 4 as the external if it is determined by the determiner 81 that the state is the input saturation state, whereas the selector 82 inputs the digital value digi2 converted by the second A/D converter 74 to the control section 4 as the external if it is determined by the determiner 81 that the state is not the input saturation state.

A description will be made with use of FIG. 4 about operation when the voltage value of the analog vibration signal sg is 2.5 V±0.1 V, i.e. when the detected vibration amplitude value is present in the minute region (within the range of 2.5 V±0.625 V), in the above-described configuration.

First, the analog vibration signal sg that varies in a range of 2.5 V±0.1 V is output from the vibration detecting sensor 1 and the analog vibration signal sg1 with the same variation is input to the first A/D converter 73 via the analog amplitude amplifier 71 to be converted to the digital value digi1 whose value range is 2048±82 [lsb]. Next, the offset value of 2048 [lsb] is subtracted from this digital value digi1 by the adder 75 in order to set the reference point from 2.5 V to 0 V, so that the value range of the digital value digi1 becomes ±82 [lsb]. At last, the digital value digi1 is amplified by a factor of four by the multiplier 79 based on the software gain and the range thereof becomes ±328 [lsb]. The digital value is input to the selector 82.

On the other hand, the analog vibration signal sg is amplified via the analog amplitude amplifiers 71 and 72 to become the analog vibration signal sg2 that varies in a range of 2.5 V±0.4 V. This analog vibration signal sg2 is input to the second A/D converter 74 and converted to the digital value digi2 whose value range is 2048±328 [lsb]. Next, the offset value of 2048 [lsb] is subtracted from this digital value digi2 by the adder 76 in order to set the reference point from 2.5 V to 0 V, so that the value range of the digital value digi2 becomes ±328 [lsb]. The digital value is input to the selector 82.

In this case, the determiner 81 determines that the state is not the input saturation state because the value range of the digital value digi1 is ±328 [lsb]. As a result, the selector 82 outputs the digital value digi2 digitalized in the second A/D converter 74 at a high resolution to the control section 4 as the external. As shown in FIG. 4, the range of ±0.625 V as the minute region is represented by 4096 [lsb] and the vibration digitalized at the high resolution can be reproduced.

Figure 5:
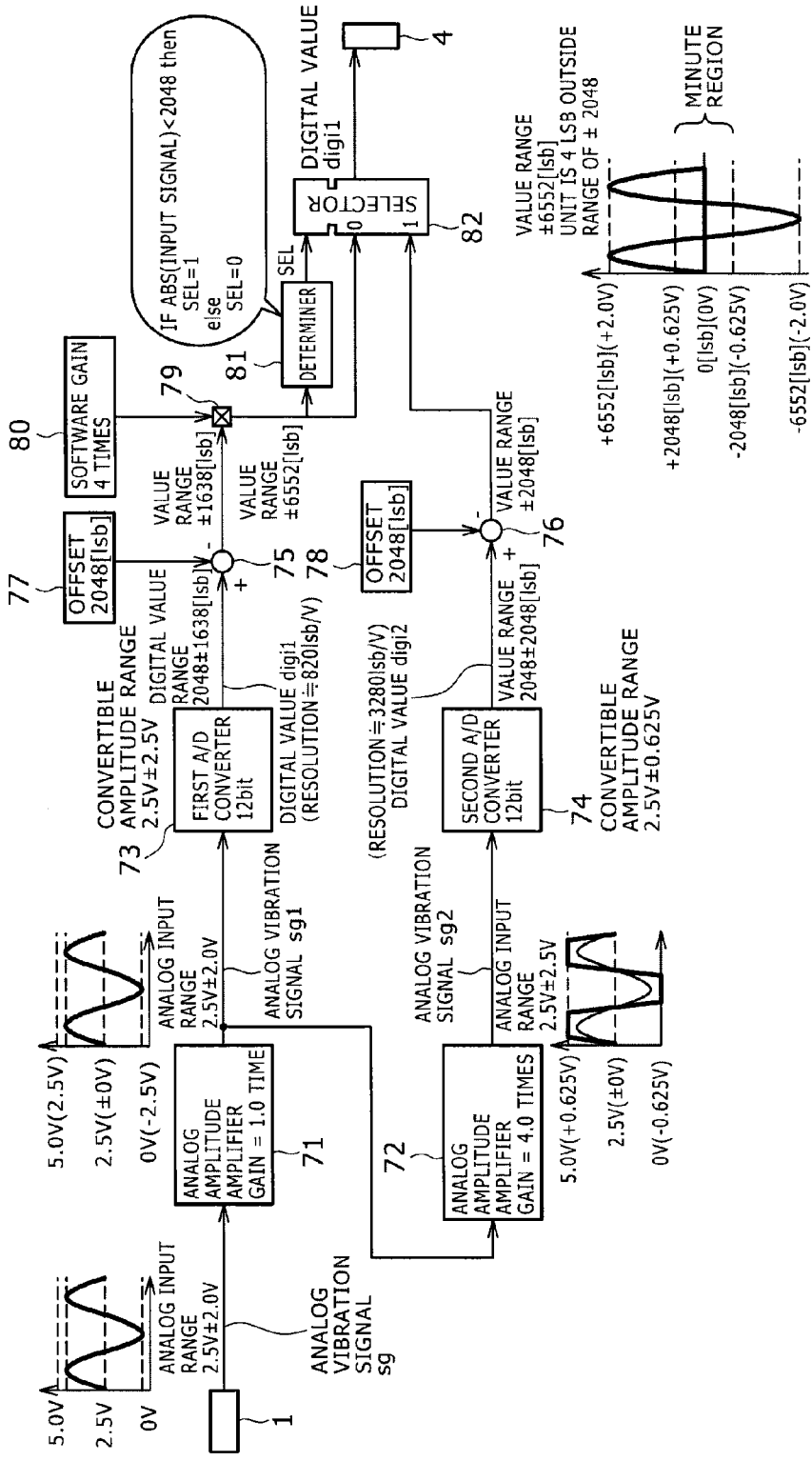
FIG. 5 is a block diagram relating to the configuration of the A/D conversion device and operation when the vibration amplitude value is absent in the minute region.

Similarly, a description will be made with use of FIG. 5 about operation when the voltage value of the analog vibration signal sg is 2.5 V±2.0 V, i.e. when the detected vibration amplitude value is absent in the minute region (outside the range of 2.5 V±0.625 V).

First, the analog vibration signal sg that varies in a range of 2.5 V±2.0 V is output from the vibration detecting sensor 1 and the analog vibration signal sg1 with the same variation is input to the first A/D converter 73 via the analog amplitude amplifier 71 to be converted to the digital value digi1 whose value range is 2048±1638 [lsb]. Next, the offset value of 2048 [lsb] is subtracted from this digital value digi1 by the adder 75 in order to set the reference point from 2.5 V to 0 V, so that the value range of the digital value digi1 becomes ±1638 [lsb]. At last, the digital value digi1 is amplified by a factor of four by the multiplier 79 based on the software gain and the range thereof becomes ±6552 [lsb]. The digital value is input to the selector 82.

On the other hand, the analog vibration signal sg is amplified via the analog amplitude amplifiers 71 and 72 to become the analog vibration signal sg2 that varies in a range of 2.5 V±8.0 V. This analog vibration signal sg2 is input to the second A/D converter 74 and the state becomes the input saturation state. The analog vibration signal sg2 is converted to the digital value digi2 whose value range is 2048±2048 [lsb]. Next, the offset value of 2048 [lsb] is subtracted from this digital value digi2 by the adder 76 in order to set the reference point from 2.5 V to 0 V, so that the value range of the digital value digi2 becomes ±2048 [lsb]. The digital value is input to the selector 82.

In this case, the determiner 81 determines that the state is the input saturation state because the value range of the digital value digi1 is ±6552 [lsb]. As a result, the selector 82 outputs the digital value digi1 digitalized in the first A/D converter 73 to the control section 4 as the section that uses it. As shown in FIG. 5, the range of ±0.625 V as the minute region is represented by 4096 [lsb] and the vibration digitalized at the high resolution of about 3280 [lsb]/V can be reproduced. In addition, although the resolution is coarser compared with the minute region, i.e. about 820 [lsb]/V, in the wide-range region outside ±0.625 V as the minute region, it is prevented that the state becomes the input saturation state beyond the range of the amplitude that can be digitalized and conversion to an accurate digital value becomes impossible.

As described above, for inputting the analog vibration signal sg from the vibration detecting sensor 1 to detect the vibration to the A/D conversion device of the present embodiment and converting it to the digital value digi (digi1, digi2) to output the converted digital value digi (digi1, digi2) to the control section 4 as the external, the A/D conversion device of the present embodiment includes the first A/D converter 73 to which the analog vibration signal sg1 corresponding to the analog vibration signal sg input from the vibration detecting sensor 1 is input and that converts it to the digital value digi1, and the second A/D converter 74 to which the analog vibration signal sg2 as an amplified signal equivalent to a signal obtained by amplifying the analog vibration signal sg1 input to the first A/D converter 73 is input and that converts it to the digital value digi2. The A/D conversion device further includes the determiner 81 that determines whether or not the state is the input saturation state in which the amplitude value of the analog vibration signal sg2 as the amplified signal input to the second A/D converter 74 exceeds the range of the amplitude that can be converted by the second A/D converter 74. The A/D conversion device further includes the selector 82 that outputs only the digital value digi1 converted by the first A/D converter 73 if it is determined by the determiner 81 that the state is the input saturation state, and outputs only the digital value digi2 converted by the second A/D converter 74 if it is determined by the determiner 81 that the state is not the input saturation state.

If the configuration is made in this manner, when the state is not the input saturation state in which the amplitude value of the analog vibration signal sg2 as the amplified signal input to the second A/D converter 74 exceeds the range of the amplitude that can be converted by the second A/D converter 74, i.e. when the detected vibration is present in the minute region, the analog vibration signal sg2 as the amplified signal is digitalized to digitalize the amplitude value of the vibration in the minute region at a high resolution and output only this digital value digi2 to the external. On the other hand, when the state is the input saturation state, i.e. when the detected vibration exceeds the minute region, the analog vibration signal sg1 is digitalized to digitalize the amplitude value of the vibration in the wide-range region other than the minute region at a normal resolution and output only this digital value digi1 to the external. Thereby, the amplitude value of the vibration in the wide-range region can be accurately captured and the amplitude value of the vibration in the minute region for which a high resolution is necessary can be properly digitalized.

Furthermore, in the present embodiment, the determiner 81 determines that the state is the input saturation state if the digital value digi1 obtained by the first A/D converter 73 exceeds a predetermined threshold, and determines that the state is not the input saturation state if the digital value digi1 does not exceed the predetermined threshold. Thus, whether or not the state is the input saturation state can be effectively determined depending on setting of the predetermined threshold.

Moreover, in the present embodiment, the change rate for the amplitude value variation of the analog vibration signal sg input from the vibration detecting sensor 1 and the zero point are equalized between the digital value digi1, which is obtained by the first A/D converter 73 and is output to the control section 4 as the external, and the digital value digi2, which is obtained by the second A/D converter and is output to the control section 4 as the external. Thus, even when the digital value digi output to the control section 4 as the external is switched, the continuity of the digital value digi indicating the amplitude value of the vibration is ensured and the occurrence of data missing can be prevented.

Therefore, if such an A/D conversion device is applied to a damping device, the damping performance can be enhanced. Furthermore, by equipping a vehicle with the damping device to which the A/D conversion device is applied, the reliability and endurance relating to the damping function of this vehicle can be effectively enhanced and the excellent running function can be realized.

Although one embodiment of the present disclosure is described above, the specific configurations of the respective sections are not limited only to the above-described embodiment.

For example, in the present embodiment, the analog vibration signal sg1 input to the first A/D converter 73 is via the analog amplitude amplifier 71 and the analog vibration signal sg2 input to the second A/D converter 74 is via the analog amplitude amplifier 72. However, in the present disclosure, any amplifier circuit may be used as long as the signal input to the second A/D converter is a signal equivalent to a signal obtained by amplifying the signal input to the first A/D converter. For example, a general configuration to amplify a signal in an analog circuit can be employed. Examples of the configuration include a configuration in which a signal An2 is obtained by inversion amplification of the signal input to the first A/D converter 73 and An3 is obtained by further performing inversion amplification of this An2 to input the signal obtained based on the difference between An2 and An3 to the second A/D converter.

Figure 6:
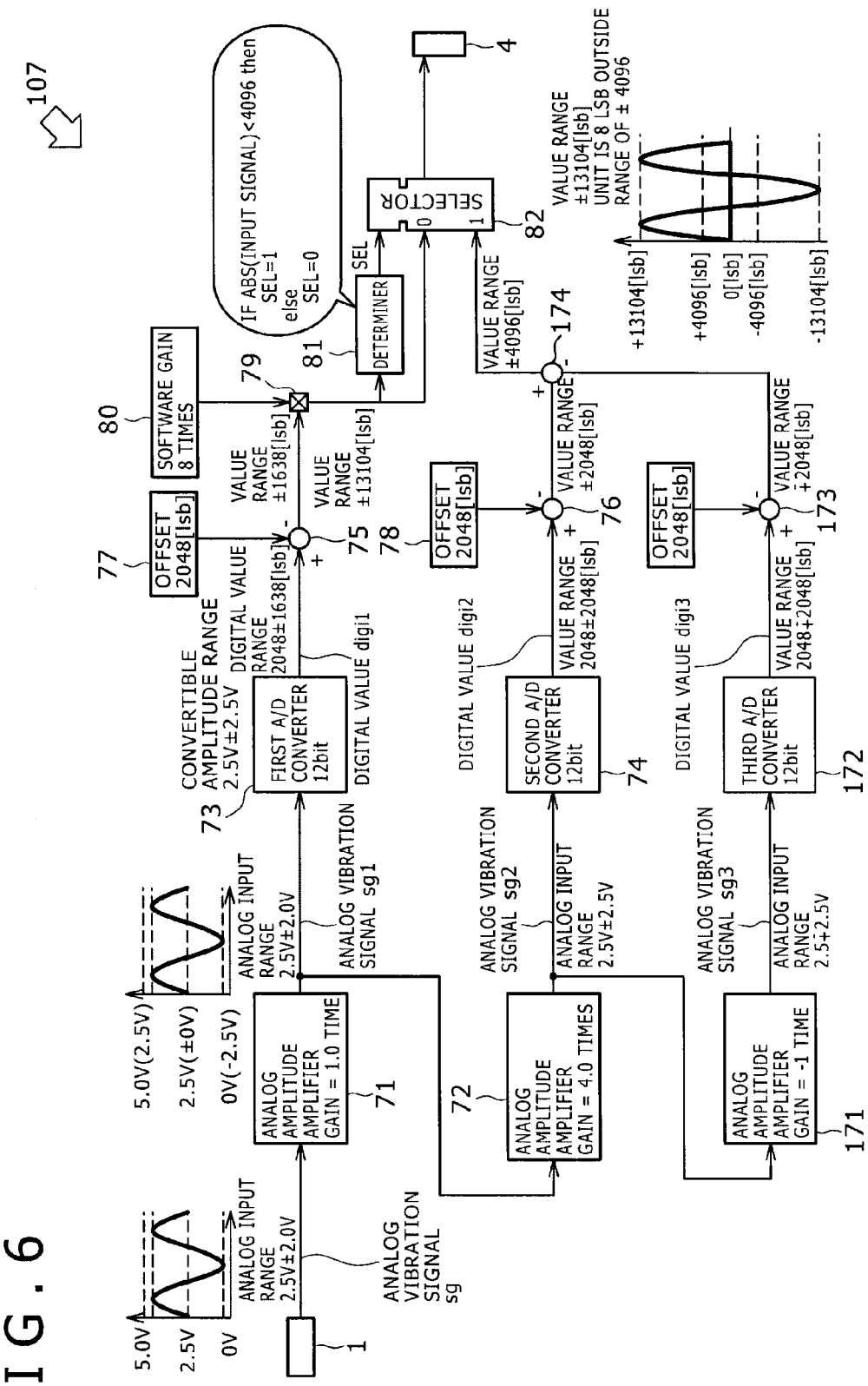
FIG. 6 is a block diagram showing the configuration of an A/D conversion device according to another embodiment of the present disclosure.

Furthermore, to obtain a further higher resolution, as shown in FIG. 6, an A/D conversion device 107 configured by enhancing the software gain of multiplication by the multiplier 79 of the present embodiment to a gain of eight times and further adding an analog amplitude amplifier 171, a third A/D converter 172, and adders 173 and 174 is available. Specifically, the analog vibration signal sg2 output from the analog amplitude amplifier 72 is input to the analog amplitude amplifier 171 and the analog amplitude amplifier 171 outputs an analog vibration signal sg3 that is a signal obtained by inverting the amplitude (voltage) of the analog vibration signal sg2. The analog vibration signal sg3 is input to the third A/D converter 172 and the third A/D converter 172 converts it to a digital value digi3 and outputs it. An offset value of 2048 [lsb] is subtracted from the digital value digi3 output from the A/D converter 172 by the adder 173 and the reference point (zero point) becomes 0. The digital value digi3 is added to the digital value digi2 output from the adder 76 by the adder 174 to be input to the selector 82.

Moreover, in the present embodiment, the determiner 81 determines whether or not the state is the input saturation state by monitoring the digital value digi1. However, a configuration in which the determiner 81 monitors the digital value digi2 may be used and a configuration in which the determiner 81 monitors another part may be used.

In addition, various changes, such as application of the present disclosure to a moving device other than the car and pieces of apparatus in which vibration occurrence is a problem, are possible without departing from the gist of the present disclosure.

INDUSTRIAL APPLICABILITY

According to the present disclosure described in detail above, it is determined whether or not the state is the input saturation state in which the amplitude value of the amplified signal input to the second A/D converter exceeds the range of the amplitude that can be converted by the second A/D converter. If it is determined that the state is the input saturation state, the digital value obtained by converting the analog vibration signal is output. If it is determined that the state is not the input saturation state, the digital value obtained by converting the amplified signal equivalent to a signal obtained by amplifying the analog vibration signal is output. This can inexpensively realize an A/D conversion device in which the resolution becomes a high resolution when the state is not the input saturation state and the convertible amplitude range becomes a wide range when the state is the input saturation state. Furthermore, this A/D conversion device can be applied to a damping device and other signal processing devices.

What is claimed is:

1. An A/D conversion device comprising:
   a first A/D converter configured to receive an analog vibration signal corresponding to a vibration detected by a vibration detecting sensor and convert the analog vibration signal to a first digital value;
   a digital amplifier configured to digitally amplify the amplitude of the first digital value and output an amplified first digital value;
   an analog amplifier configured to amplify the amplitude of the analog vibration signal and output an amplified signal;
   a second A/D converter configured to convert the amplified signal to a second digital value;
   a determiner configured to determine whether an amplitude of the amplified signal input to the second A/D converter exceeds a range of amplitude that is convertible by the second A/D converter; and
   a selector configured to receive the amplified first digital value and the second digital value, output the amplified first digital value when the determiner determines that the amplitude of the amplified signal exceeds the range of amplitude, and output the second digital value when the determiner determines that the amplitude of the amplified signal does not exceed the range of amplitude,
   wherein
      the digital amplifier and the analog amplifier have a same gain, the gain causing the amplitude of the first digital value and analog vibration signal to be greater than the amplitude before amplification, and
      the amplified first digital value and the second digital value have a same change rate and a same zero point with respect to an amplitude variation of the vibration detected by the vibration detecting sensor wherein the determiner makes a determination based on whether the amplified first digital value or the second digital value exceeds a predetermined threshold.

2. The A/D conversion device according to claim 1, wherein the determiner makes the determination based on the amplified first digital value.

3. The A/D conversion device according to claim 2, wherein the selector selects and outputs one of the amplified first digital value and the second digital value in accordance with the determination by the determiner.

4. The A/D conversion device according to claim 1, further comprising:
- a third analog amplifier configured to further amplify the amplified signal with a gain of −1 (minus one) and output the third amplified signal;
- a third A/D converter configured to convert the third amplified signal to a third digital value;
- a combiner configured to combine the second digital value and the third digital value, and output a combined digital value to the selector, the selector selecting and outputting one of the first digital value and the combined digital value in accordance with the determination by the determiner.

5. The A/D conversion device according to claim 4, wherein the digital amplifier has twice a gain of that of the analog amplifier.

6. The A/D conversion device according to claim 1, further comprising:
- an initial analog amplifier configured to receive and amplify a detection signal from the vibration detecting sensor and output the analog vibration signal.

7. The A/D conversion device according to claim 6, wherein the initial analog amplifier has a gain of +1 (plus one).

8. A damping device, comprising:
an A/D conversion device including:
- a first A/D converter configured to receive an analog vibration signal corresponding to a vibration detected by a vibration detecting sensor and convert the analog vibration signal to a first digital value,
- a digital amplifier configured to digitally amplify the amplitude of the first digital value and output an amplified first digital value,
- an analog amplifier configured to amplify the amplitude of the analog vibration signal and output an amplified signal,
- a second A/D converter configured to convert the amplified signal to a second digital value,
- a determiner configured to determine whether an amplitude of the amplified signal input to the second A/D converter exceeds a range of amplitude that is convertible by the second A/D converter, and
- a selector configured to receive the amplified first digital value and the second digital value, output the amplified first digital value when the determiner determines that the amplitude of the amplified signal exceeds the range of amplitude, and output the second digital value when the determiner determines that the amplitude of the amplified signal does not exceed the range of amplitude,
wherein
- the digital amplifier and the analog amplifier have a same gain, the gain causing the amplitude of the first digital value and analog vibration signal to be greater than the amplitude before amplification, and
- the amplified first digital value and the second digital value have a same change rate and a same zero point with respect to an amplitude variation of the vibration detected by the vibration detecting sensor wherein the determiner makes a determination based on whether the amplified first digital value or the second digital value exceeds a predetermined threshold.

9. A vehicle, comprising:
a damping device including:
an A/D conversion device that includes:
- a first A/D converter configured to receive an analog vibration signal corresponding to a vibration detected by a vibration detecting sensor and convert the analog vibration signal to a first digital value,
- a digital amplifier configured to digitally amplify the amplitude of the first digital value and output an amplified first digital value,
- an analog amplifier configured to amplify the amplitude of the analog vibration signal and output an amplified signal,
- a second A/D converter configured to convert the amplified signal to a second digital value,
- a determiner configured to determine whether an amplitude of the amplified signal input to the second A/D converter exceeds a range of amplitude that is convertible by the second A/D converter, and
- a selector configured to receive the amplified first digital value and the second digital value, output the amplified first digital value when the determiner determines that the amplitude of the amplified signal exceeds the range of amplitude, and output the second digital value when the determiner determines that the amplitude of the amplified signal does not exceed the range of amplitude,
wherein
- the digital amplifier and the analog amplifier have a same gain, the gain causing the amplitude of the first digital value and analog vibration signal to be greater than the amplitude before amplification, and
- the amplified first digital value and the second digital value have a same change rate and a same zero point with respect to an amplitude variation of the vibration detected by the vibration detecting sensor wherein the determiner makes a determination based on whether the amplified first digital value or the second digital value exceeds a predetermined threshold.

10. A vibration damping apparatus, comprising:
- a vibration sensor, provided on an object, configured to detect a vibration of the object and generate a vibration signal;
- an A/D conversion device configured to convert the vibration signal to a digital vibration signal, the A/D conversion device including,
  - a first A/D converter configured to convert the vibration signal to a first digital signal,
  - a digital amplifier configured to digitally amplify the amplitude of the first digital value and output an amplified first digital value,
  - an analog amplifier configured to amplify the amplitude of the vibration signal and output an amplified signal,
  - a second A/D converter configured to convert the amplified signal to a second digital signal,
  - a determiner configured to determine whether an amplitude of the amplified signal exceeds a range of amplitude that is convertible by the second A/D converter, and
  - a selector configured to select and output one of the amplified first digital value and the second digital value in accordance with the determination of the determiner;
- a controller configured to receive an output of the selector and output a control signal based on the output of the selector; and
- an electric actuator configured to reciprocate a mass in accordance with the control signal from the controller, wherein the digital amplifier and the analog amplifier have a same gain, the gain causing the amplitude of the first digital value and vibration signal to be greater than the amplitude before amplification, and the amplified first digital value and the second digital value have a same change rate and a same zero point with respect to an amplitude variation of the vibration detected by the vibration detecting sensor wherein the determiner makes a determination based on whether the amplified first digital value or the second digital value exceeds a predetermined threshold.

11. The vibration damping apparatus according to claim 10, wherein the object has an internal combustion engine, the vibration damping apparatus further comprising:

a reference wave generator configured to receive ignition pulses for the internal combustion engine and generates a reference sine wave signal based on the ignition pulses, the controller generating the control signal based on the output of the selector and the reference sine wave signal.

12. The vibration damping apparatus according to claim 11, wherein the reference wave generator further generates a reference cosine wave signal based on the ignition pulses.

\* \* \* \* \*